(12) United States Patent
Ghoshal et al.

(10) Patent No.: US 11,982,473 B2
(45) Date of Patent: May 14, 2024

(54) PORTABLE TEMPERATURE REGULATED CONTAINER

(71) Applicant: Sheetak, Inc., Austin, TX (US)

(72) Inventors: Uttam Ghoshal, Austin, TX (US); James Borak, Dale, TX (US); Key Kolle, Luling, TX (US); Dan Grimm, Round Rock, TX (US)

(73) Assignee: Sheetak, Inc., Austin, TX (US)

( * ) Notice: Subject to any disclaimer, the term of this patent is extended or adjusted under 35 U.S.C. 154(b) by 7 days.

(21) Appl. No.: 16/963,246

(22) PCT Filed: Jan. 18, 2019

(86) PCT No.: PCT/US2019/014281
§ 371 (c)(1),
(2) Date: Jul. 19, 2020

(87) PCT Pub. No.: WO2019/143996
PCT Pub. Date: Jul. 25, 2019

(65) Prior Publication Data
US 2021/0285698 A1 Sep. 16, 2021

Related U.S. Application Data

(60) Provisional application No. 62/619,246, filed on Jan. 19, 2018.

(51) Int. Cl.
*F25B 21/02* (2006.01)
*H10N 10/17* (2023.01)

(52) U.S. Cl.
CPC .............. *F25B 21/02* (2013.01); *H10N 10/17* (2023.02); *F25B 2321/021* (2013.01); *F25B 2321/023* (2013.01); *F25B 2321/0251* (2013.01)

(58) Field of Classification Search
CPC .... F25B 21/02; F25B 21/04; F25B 2321/021; F25B 2321/023; F25B 2321/0251; F25B 2321/02; H01L 35/32; H10N 10/17
See application file for complete search history.

(56) References Cited

U.S. PATENT DOCUMENTS 3,125,860 A 3/1964 Reich
4,971,632 A 11/1990 Rowe
(Continued)

FOREIGN PATENT DOCUMENTS

JP 2009011574 A * 1/2009 ............... A01N 1/00
KR 200387125 Y1 * 6/2005
(Continued)

OTHER PUBLICATIONS

Partial English Machine Translation JP-2009011574-A. Accessed Jun. 2022.*

*Primary Examiner* — Tavia Sullens
(74) *Attorney, Agent, or Firm* — Clark Hill, PLC (57) ABSTRACT

A portable, independent thermoelectric temperature regulated system for providing active cooling to one or more payloads. The system includes a thermally insulated housing, one or more thermoelectric converters embedded in the thermally insulated housing, and a power source. The system may include one or more optional payload containers. Multiple payload containers may be used in the same housing. The system includes a control circuit for managing temperature of the payload(s) based on user selections. The housing may be hard or soft, and the multiple payload containers may be maintained at different temperatures. Optional phase change materials may be included that may be charged by the active thermoelectric converter discharged as a source of passive cooling or heating.

2 Claims, 9 Drawing Sheets

(56) References Cited

U.S. PATENT DOCUMENTS

| | | | |
|---|---|---|---|
| 6,412,286 B1* | 7/2002 | Park | H01L 35/00 |
| | | | 62/3.6 |
| 6,492,585 B1 | 12/2002 | Zamboni | |
| 6,658,857 B1* | 12/2003 | George | F25B 21/04 |
| | | | 165/121 |
| 2002/0062853 A1 | 5/2002 | Kajihara | |
| 2006/0188418 A1* | 8/2006 | Park | F25D 17/042 |
| | | | 422/26 |
| 2006/0272337 A1* | 12/2006 | Ito | B60N 2/5635 |
| | | | 62/3.61 |
| 2008/0022696 A1* | 1/2008 | Welle | F25B 21/04 |
| | | | 62/3.7 |
| 2008/0163628 A1* | 7/2008 | Lilke | F25B 21/02 |
| | | | 62/3.6 |
| 2011/0000224 A1 | 1/2011 | Ghoshal | |
| 2011/0016886 A1* | 1/2011 | Ghoshal | F25B 21/02 |
| | | | 62/3.2 |
| 2013/0153819 A1 | 6/2013 | Tseng | |
| 2014/0137918 A1 | 5/2014 | Zirkle | |
| 2015/0013740 A1 | 1/2015 | Kaibe | |
| 2015/0040605 A1* | 2/2015 | Gorz | F25D 17/04 |
| | | | 312/405 |
| 2016/0042932 A1* | 2/2016 | Hannigan | F25B 21/02 |
| | | | 250/282 |
| 2016/0178252 A1* | 6/2016 | Nakamura | F25B 21/04 |
| | | | 62/3.3 |
| 2019/0162453 A1* | 5/2019 | Oh | F25B 21/02 |

FOREIGN PATENT DOCUMENTS

| | | | |
|---|---|---|---|
| KR | 100709574 B1 * | 4/2007 | |
| KR | 20100121334 A * | 11/2010 | |

\* cited by examiner

FIG. 3A  Isolated

FIG. 3B  Open

PORTABLE TEMPERATURE REGULATED CONTAINER

BACKGROUND OF THE DISCLOSURE

1. Field of Disclosure

The disclosure relates to cooling and heating, and specifically to thermoelectric-based cooling and heating systems and methods.

2. Description of the Related Art

Portable refrigeration is essential to the transport of small, temperature sensitive articles and substances, especially in locations where large scale refrigeration systems are not available, practical, or cost effective. Small payloads ranging from transplant organs and pharmaceutical vials to picnic lunches may require refrigeration for short or long periods of time.

Some early forms of refrigeration involved storing ice in a container, which is epitomized by the common icebox of the $19^{th}$ and early $20^{th}$ centuries. Ice storage boxes could be scaled such that handling and unassisted transport was possible for a single person. Later refrigeration systems use conventional vapor-compression cycle, which were not limited to duration that it took for the ice to melt. Using electrical power from a power grid, the vapor-compression cycle refrigerators could provide long term refrigeration at controlled temperatures. However, the now common household refrigerator also required a heavy motor and a large electrical power supply. Even the smaller scale versions of the standard refrigerator, the so-called "mini fridges" are not portable by a single individual without lifting equipment or a vehicle for transport when the power supply is taken into consideration.

One shortcoming of prior art portable refrigeration systems is that the cooling provided is passive. The cooling provided by ice or any other phase change material (PCM), such as dry ice or chemical cold packs, is not consistently applied to the payload. As the PCM absorbs heat, the cooling effect on the payload diminishes. This means that during early use the payload may be kept at too low a temperature and during later use the payload may be kept at too high a temperature.

Another shortcoming of the prior art portable refrigeration systems is that PCMs are heavy relative to their heat capacity. PCMs may provide a heat capacity of around 50 Watt-hours per kilogram and have a density around 1 gram per cubic centimeter. This means that the amount of PCM in a portable refrigeration device is significantly limited by the weight of the PCM and the payload volume is limited by the volume that the PCM occupies.

Another shortcoming of the prior art portable refrigeration systems is that the PCM material has a limited heat capacity that requires replacement of the PCM for extended refrigeration. Once the PCM heat capacity is exhausted, the system would be opened so that the exhausted PCM could be switched out with a newly "charged" PCM, which could expose the payload to the ambient environment temperatures or contamination.

Another shortcoming of the prior art portable refrigeration systems is that, if a PCM could be partially recharged, the PCM cooling capacity would be diminished relative to a fully discharged PCM due to hysteresis. Thus, repeated use without fully discharging the PCM would shorten the cooling lifetime of the system until the fully recharged PCM could be obtained.

What is needed is a portable refrigeration system that reduces the weight and bulk of conventional portable refrigeration systems while allowing controlled regulation of the temperature of the payload.

BRIEF SUMMARY OF THE DISCLOSURE

In aspects, the present disclosure is related to systems and apparatuses for providing cooling and heating, specifically for portable thermoelectric cooling and heating of a chamber to maintain a desired temperature.

One embodiment according to the present disclosure includes portable temperature regulated system comprising: a thermally insulated housing with air circulation openings and a raised guard maintaining spacing for the openings to maintain air circulation; a payload container; a thermoelectric engine, the engine including one or more thermoelectric converters, each having a hot side and a cold side; a hot side circulation housing to circulate a first fluid between ambient and the hot side(s) of the one more thermoelectric converters; a cold side circulation housing to circulate a second fluid between the cold side(s) of the one or more thermoelectric converters and the insulated payload container; wherein the cold side circulation housing includes a set of louvers interior to the cold side circulation housing and a set of actuators in communication with louvers and configured to control a flow path of the second fluid; a power source in electrical communication with the thermoelectric converters and the actuators; and a control circuit in electrical communication with the thermoelectric converters, the actuators, and the power source.

Another embodiment according to the present disclosure includes system for portable temperature control, including: a thermally insulated housing; a chamber formed within the thermally insulated housing; a first thermoelectric converter having a hot side and a cold side, wherein one of the hot side and the cold side is in thermal communication with the chamber and the other of the hot side and the cold side is in thermal communication with an ambient environment; a first power source in electrical communication with the first thermoelectric converter; and a first control circuit in electrical communication with the first thermoelectric converter. The system may also include an interior container disposed within the thermally insulated housing coterminous with the chamber. The thermally insulated housing may include one or more of: an aerogel, polystyrene fibers, and a vacuum insulated panel. The first power source may be partially embedded in the thermally insulated housing and the at least part of the first power source may be in direct contact with the ambient environment. The system may optionally include a second thermoelectric converter having a hot side and a cold side, wherein one of the hot side and the cold side is in thermal communication with the chamber and the other of the hot side and the cold side is in thermal communication with an ambient environment; a second power source in electrical communication with the second thermoelectric converter; and a second control circuit in electrical communication with the second thermoelectric converter. The hot side of the first thermoelectric converter may be in thermal communication with the chamber and the cold side of the second thermoelectric converter may be in thermal communication with the chamber. The second power source may be partially embedded in the thermally insulated housing and the at least part of the second power source may be in direct contact with the ambient environment.

Another embodiment according to the present disclosure includes a system for portable temperature control, including: a thermally insulated housing; a plurality of chambers formed within the thermally insulated housing; a plurality of thermoelectric converters, each having a hot side and a cold side and each associated with one of the plurality of chambers, and wherein one of the hot side and the cold side of each of the plurality of thermoelectric converters is in thermal communication with the chamber and the other of the hot side and the cold side is in thermal communication with an ambient environment; a plurality of power sources associated with and in electrical communication with the plurality of thermoelectric converters; and a plurality of control circuits in electrical communication with the plurality of thermoelectric converters. The thermally insulated housing may include one or more of: n aerogel, polystyrene fibers, and a vacuum insulated panel. Each of the plurality of power sources may be partially embedded in the thermally insulated housing and the at least part of the each of the plurality of power sources may be in direct contact with the ambient environment.

Another embodiment according to the present disclosure includes a system for portable temperature control, including: a thermally insulated housing; a chamber formed within the thermally insulated housing; a plurality of thermoelectric converters, each having a hot side and a cold side and each disposed in the thermally insulated housing with one of the hot side and the cold side in thermal communication with the chamber and the other of the hot side and the cold side is in thermal communication with an ambient environment; a removable insulated partition disposed in the chamber and separating the two subchambers, where each of the subchambers is associated with at least one of the plurality of thermoelectric converters; a plurality of power sources associated with and in electrical communication with the plurality of thermoelectric converters; and a plurality of control circuits in electrical communication with the plurality of thermoelectric converters. The thermally insulated housing and the removable insulated partition may each include one or more of: an aerogel, polystyrene fibers, and a vacuum insulated panel. Each of the plurality of power sources may be partially embedded in the thermally insulated housing and the at least part of the each of the plurality of power sources may be in direct contact with the ambient environment.

Another embodiment according to the A system for portable temperature control, including: a thermally insulated housing; a first chamber formed within the thermally insulated housing; a second chamber formed within the thermally insulated housing; a thermoelectric converter, having a hot side and a cold side, disposed between the first chamber and the second chamber, wherein one of the hot side and the cold side of each of the plurality of thermoelectric converters is in thermal communication with the first chamber and the other of the hot side and the cold side is in thermal communication with the second chamber; a power source associated with and in electrical communication with the thermoelectric converter; and a control circuit in electrical communication with the plurality of thermoelectric converter. The thermally insulated housing may include one or more of: an aerogel, polystyrene fibers, and a vacuum insulated panel. The power source may be partially embedded in the thermally insulated housing and the at least part of the power source may be in direct contact with an ambient environment.

Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

A better understanding of the present disclosure can be obtained with the following detailed descriptions of the various disclosed embodiments in the drawings, which are given by way of illustration only, and thus are not limiting the present disclosure, and wherein.

While the inventions disclosed herein are susceptible to various modifications and alternative forms, only a few specific embodiments are shown by way of example in the drawings and are described in detail below. The figures and detailed descriptions of these specific embodiments are not intended to limit the breadth or scope of the inventive concepts or the appended claims in any manner. Rather, the figures and detailed written descriptions are provided to illustrate the inventive concepts to a person of ordinary skill in the art, and to enable such persons to make and use one or more of the inventive concepts.

DETAILED DESCRIPTION OF THE DISCLOSURE

In aspects, the present disclosure is related to a system and apparatus for providing heating and/or cooling for temperature regulation. Specifically, the present disclosure is related to a thermoelectric cooling/heating system that can be carried and handled by an unaided person or a robot. The present invention is susceptible to embodiments of different forms. There are shown in the drawings, and herein will be described in detail, specific embodiments with the understanding that the present invention is to be considered an exemplification of the principles and is not intended to limit the present invention to that illustrated and described herein.

One or more illustrative embodiments incorporating the invention disclosed herein are presented below. Not all features of an actual implementation are described or shown in this application for the sake of clarity. It is understood that in the development of an actual embodiment incorporating the present invention, numerous implementation-specific decisions must be made to achieve the developer's goals, such as compliance with system-related, business-related, government-related and other constraints, which vary by implementation from time to time. While a developer's efforts might be complex and time consuming, such efforts would be, nevertheless, a routine undertaking for those of ordinary skill in the art having the benefit of this disclosure.

Figure 1:
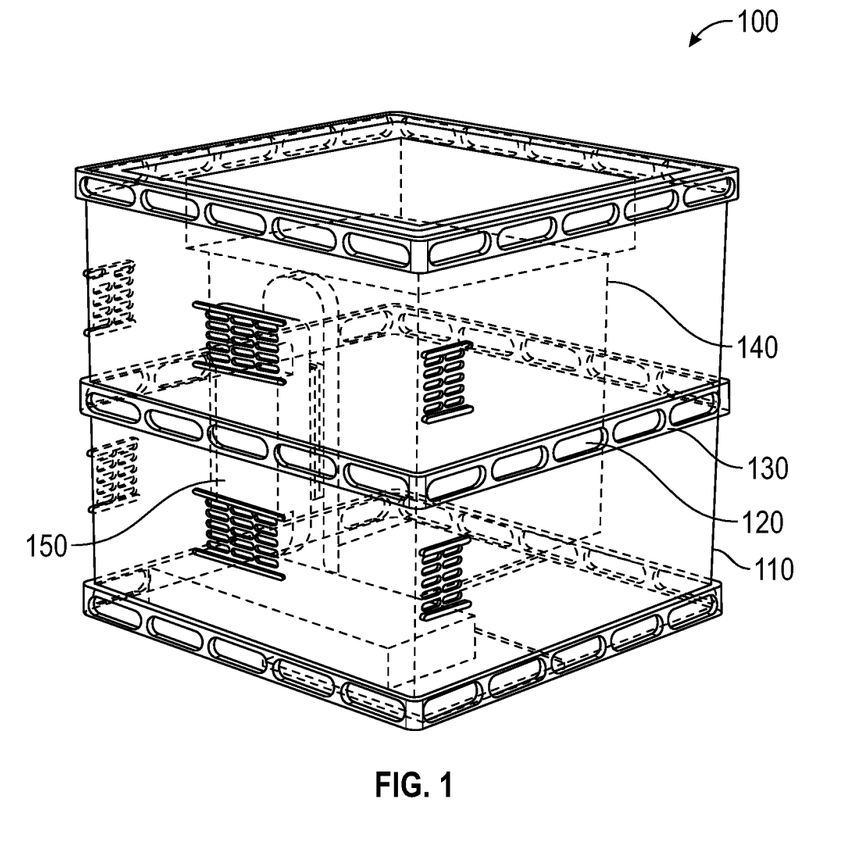
FIG. 1 shows an embodiment of the portable temperature regulated container system according to one embodiment of the present disclosure.
Figure 2A:
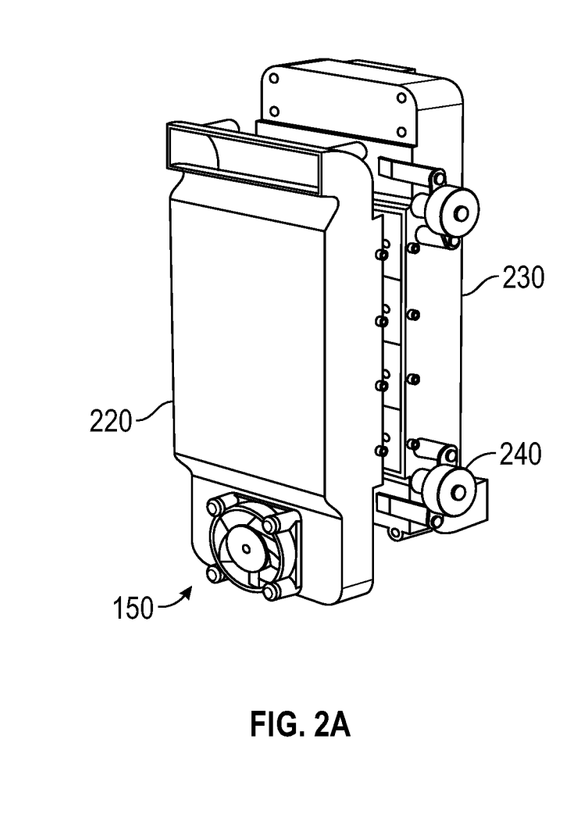
FIG. 2A shows a close up of the thermoelectric engine from FIG. 1.
Figure 2B:
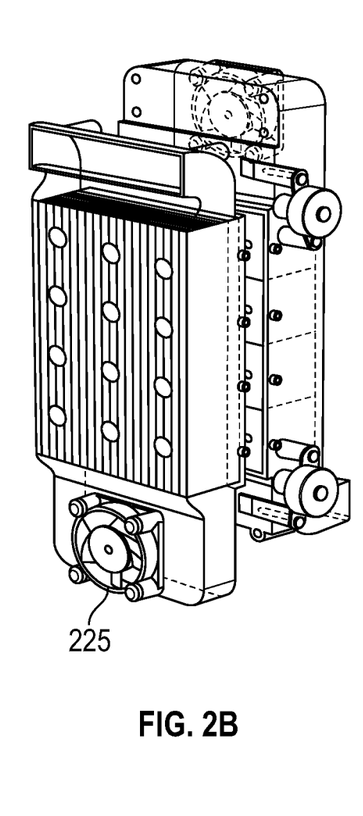
FIG. 2B shows a cut-away view of the thermoelectric engine from FIG. 1.
Figure 2C:
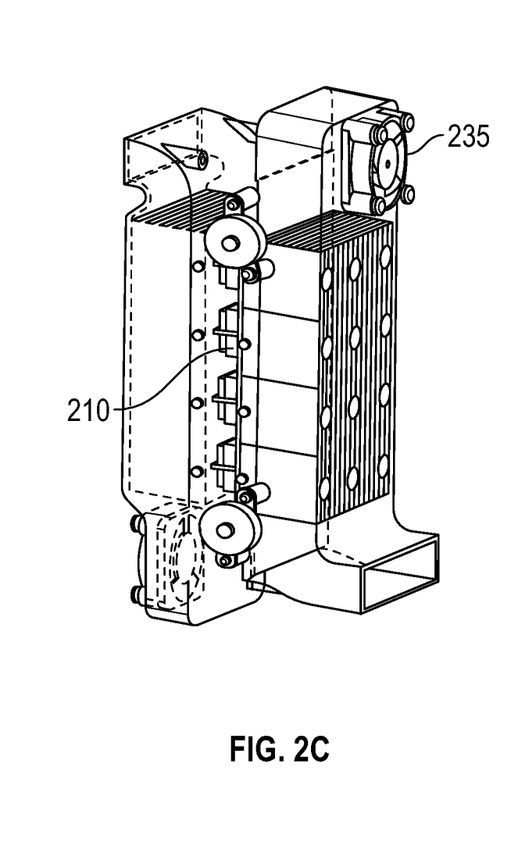
FIG. 2C shows side view of the thermoelectric engine from FIG. 1.
Figure 2D:
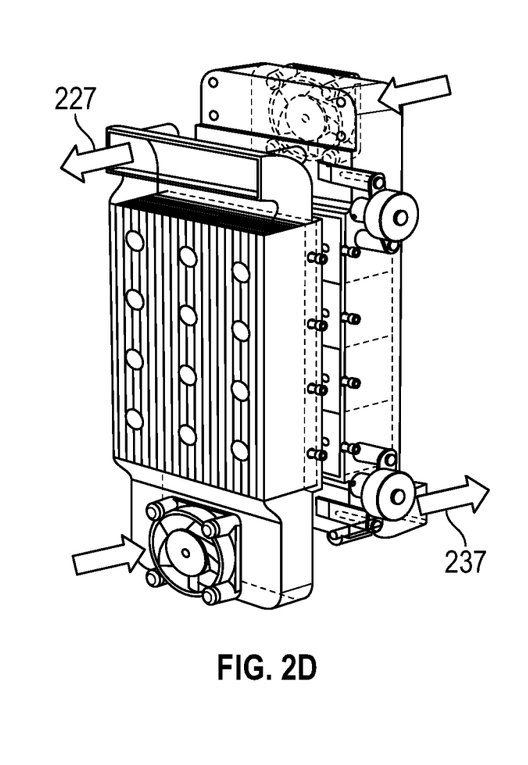
FIG. 2D shows a cut-away view of the thermoelectric engine from FIG. 1 indicating the circulation directions of heat through the engine.

FIG. 1 shows a thermoelectric portable temperature regulated container system 100. The system 100 includes a thermally insulated housing 110 with a plurality of openings 120. The housing 110 includes raised section 130 proximate to and surrounding openings 120 to maintain adequate air circulation through the openings 120 when multiple systems 100 are stacked together. The system 100 includes a payload container 140 configured to hold a payload that is to be heated, cooled or maintained at a desired temperature. The payload container 140 may use a plastic container or any form of packaging known to a person of ordinary skill in the art. In some embodiments, the payload container 140 maybe one or more of: waterproof, water resistant, and hermetically sealed. The payload container 140 may have a void within to receive the payload. In some embodiments, the payload container 140 may be configured to hold inert gases as well as the payload A thermoelectric engine 150 is embedded in the thermally insulated housing 110 and the outside of the payload container 140. The thermoelectric engine 150 may be configured to cool or heat the payload container 140 based on the orientation of one or more thermoelectric converters 210 (see FIG. 2C) and/or the configuration of the power to the thermoelectric converters 210. In some embodiments, an optional PCM (not shown) may be disposed between the housing 110 and the payload container 140. The PCM may provide temperature maintenance when the thermoelectric converters 210 are not powered, and the PCM may itself be recharged (cooled or heated depending on the configuration of the system 100. when the thermoelectric converters 210 are operating. Unlike PCM only systems, the optional PCM would not need to be removed from the system 100 for recharging. This means that the system 100 eliminates one reason for tampering or maintenance while being used to cool or heat the payload. Any PCM known to a person of ordinary skill in the art may be used. Exemplary PCMs may include, but are not limited to, ice, sodium polyacrylates for sub 0 degree C., paraffins with melting points between 0 degrees C. and 100 degrees C., waxes, natural organic oils, functionalized BioPCMs, plastic and metal-encapsulated paraffins, hydrated salts (such as sodium sulfates), inorganic eutectic solder SiBn, Sn—Ag—Cu, AuSn, and high temperature salts (such as sodium nitrates). PCMs with higher or lower melting points may be used based on the required temperature to be maintained by the system 100. As would be understand by a person of skill in the art, the above system may be reconfigured to heat or maintain a warmer than ambient temperature as well.

FIGS. 2A-2D show views of the thermoelectric engine 150. The thermoelectric engine 150 includes one or more thermoelectric converters 210 disposed between a hot side circulation housing 220 and a cold side circulation housing 230. The thermoelectric converter 210 may use any form of thermoelectric device known to a person of ordinary skill in the art that converts electrical energy into a temperature differential. When multiple converters 210 are used, the converters 210 may be arranged in series, parallel, or both. In some embodiments, the thermoelectric converters 210 may include multiple stages of thermoelectric devices, such that temperature differentials more than $\Delta T_{max}/2$~45 degrees Celsius of the thermoelectric devices may be provided. In one embodiment, standard cooling or heating involves a temperature differential across the thermoelectric converter of about 30 degrees Celsius.

Herein, the configuration of the system 100 is discussed in terms of cooling; however, a person of skill in the art will understand that the system 100 may be reconfigured for heating. The hot side (or hottest side(s) of some of the converters 210 are arranged in series) is disposed with the hot side(s) facing the hot side circulation housing 220, and, correspondingly, the cold side(s) (or coldest side(s)) of the converters 210 are disposed facing the cold side circulation housing 230. The hot side circulation housing 220 may include a circulation driver 225 to force a fluid through a hot side flow path 227. The circulation driver 225 may include, but is not limited to, one or more of: a fan and a pump. Similarly, the cold side circulation housing 230 may include a circulation driver 235 to force a fluid through the cold side flow path 237. The fluid circulation paths 227, 237 may be isolated from one another. A set of actuators 240 may be disposed on the cold side housing 230 to control isolators (see FIG. 3A) disposed within the cold side circulation housing 230. It is contemplated that a first fluid may circulated through the cold side circulation housing 230 along the fluid circulation path 237 to remove heat from the payload container 140 to the cold side of the thermoelectric converters 210. A second fluid may be circulated through the hot side circulation housing 220 along the fluid circulation path 227 to remove heat from the hot side of the thermoelectric converters 210 to the ambient environment. The first and second fluids may be the same or different. The first and second fluids may be liquid or gas.

Figure 3A:
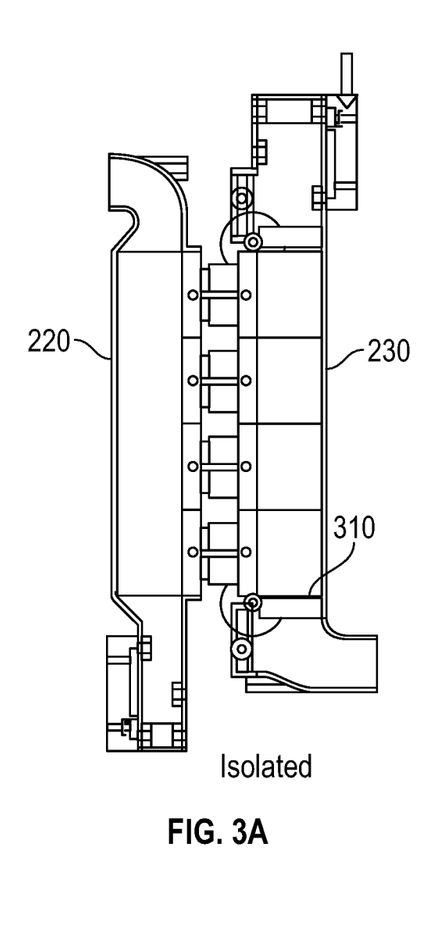
FIG. 3A shows a diagram of the isolator from the thermoelectric engine of FIG. 2D in the isolated position.
Figure 3B:
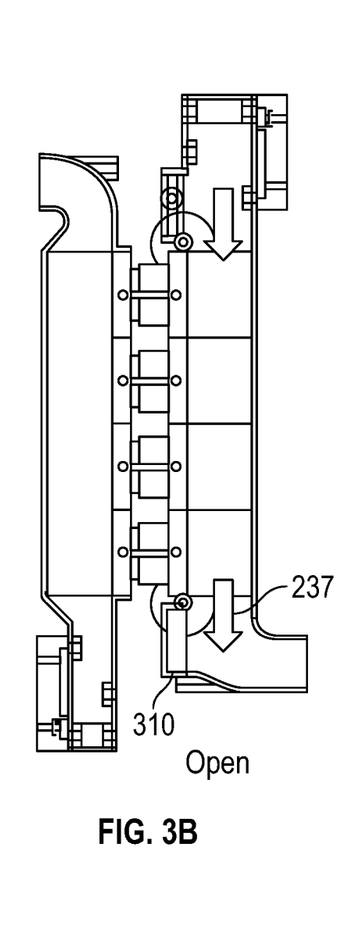
FIG. 3B shows a diagram of the isolator of FIG. 2D in the open position.

FIGS. 3A-3B show cross-sections of the thermoelectric engine 150. Within the cold side circulation housing 230 are shown two isolators 310 disposed within and configured, when in a closed position, to prevent circulation through the cold side circulation housing 230. Each of the isolators 310 may include, but is not limited to, a thermally insulating louver or a block of thermal insulation. Suitable thermal insulators may include, but are not limited to, polymer aerogel, Styrofoam, and polyurethane. Each isolator 310 is in mechanical communication with one of the actuators 240. In some embodiments, the actuators 240 may include latching rotary solenoids, so that, once operated, the isolator 310 remains in its last position (opened or closed) until acted upon by the actuator 240 again. One suitable latching rotary solenoid is a bi-stable rotary solenoid model Takano RSF22/08-0035, manufactured by Takono Co. Ltd. (Tokyo, Japan). FIG. 3A shows the isolator 310 in a closed position, such that there is no flow path through the cold side circulation housing 230. When the isolators 310 are in the closed position, heat leakage into the payload container 140 from the thermoelectric converters 210 is limited since the payload container 140 is now thermally isolated from the thermoelectric converters 210. FIG. 3B shows the isolators 310 in an open position, such that there is a flow path through the cold side circulation housing 230. Thus, heat from the payload container 140 can be removed to the thermoelectric converters 210 through the open fluid path 237 created by the isolators 310 being in the open position. In some embodiments, the cold side circulation housing 230 may be substituted for by a vapor diode or a thermal diode.

While not shown, a person of ordinary skill in the art will recognize that the heat flow from the payload container 140 to the ambient may also be isolated by disposing the isolators 310 in hot side circulation housing 220 at corresponding locations to those in the cold side circulation housing 230. Thus, it is contemplated that the isolators 310 may in disposed in the cold side circulation housing 230, the hot side circulation housing 220, or both.

Figure 4:
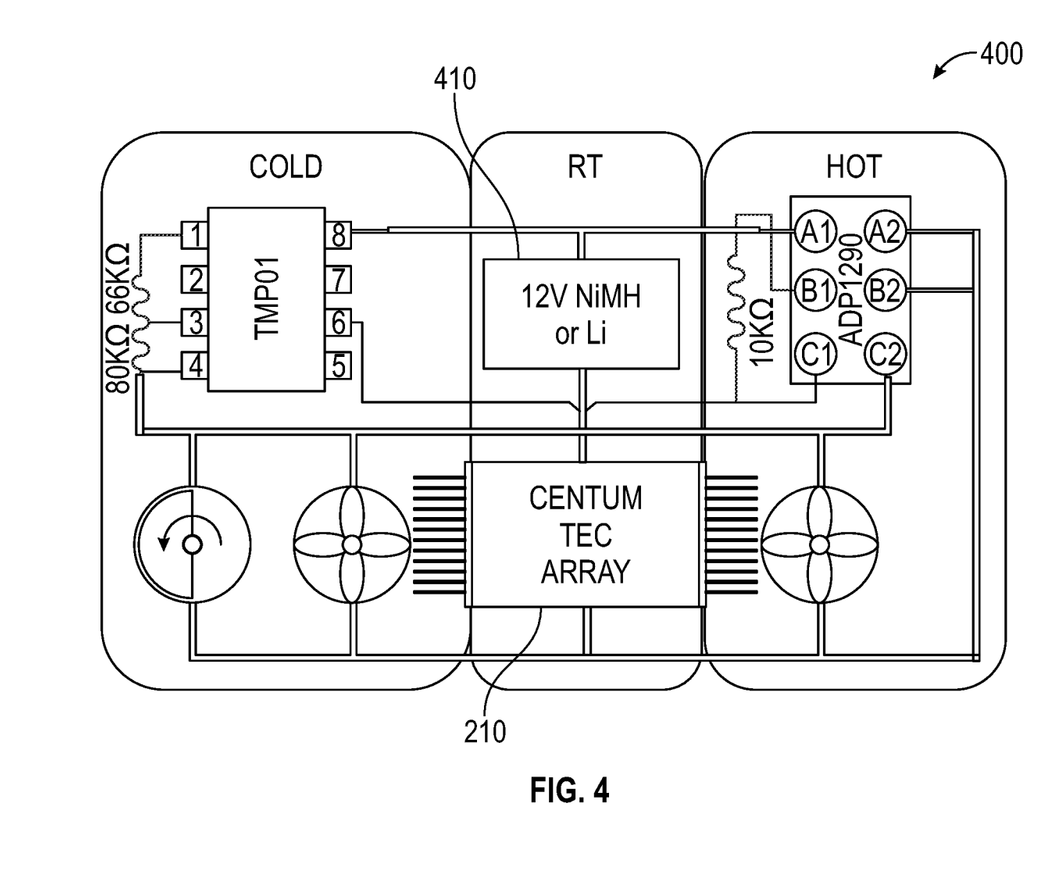
FIG. 4 shows one embodiment of a controller for the portable temperature regulated container system of FIG. 1.

FIG. 4 shows diagram of a control circuit 400 for use with the system 100. The control circuit is configured to control the operation of the thermoelectric converters 210 by regulating power going to the thermoelectric converters 210 from an electric power source 410 coupled to the thermoelectric converters 210. Since the power to the thermoelectric converters 210 can be regulated, cooling can be controlled, unlike cooling in PCM only systems. The control circuit 400 is contemplated to deliver power to the thermoelectric converters 210 to maintain a set temperature in the payload container 140. The payload container 140 may include sensors (not shown) to provide temperature feedback to the control circuit 400. The electric power source 410 may include, but is not limited to, one or more of: an AC source, a DC source, and a battery bank. In some embodiments, the electric power source 410 may be a NiMH battery or a Li+ battery. In some embodiments, the role of electric power source 410 may be filled by a battery bank integrated (permanent or removable) with the housing 110 and an external power source, such as, but not limited to, one or more of: an AC line, an electric power grid, an inverter, and a solar array. The control circuit 400 may also control the operation of the actuators 240 and may include additional components such as a monostable pulse generator to trigger a latching rotary solenoid.

By supplying active cooling with thermoelectric converters 210 and batteries with higher denser and energy storage capacity than common PCMs, the system 100 may weigh less than and stay colder longer than similarly sized PCM only based systems within certain size ranges. For example, a 400 Watt-hour cooling system using PCM would require about 8 kilograms of PCM occupying a volume of about 8000 cubic centimeters. The system 100, using batteries with specific energy of 120 Watt-hour per kilogram and 5-8 grams per cubic centimeter density, would only require 3.3 kilograms of mass and occupy about 417 to 667 cubic centimeters of volume. With a thermoelectric engine that weighs 1 kilogram or less, it is apparent that the system 100 can provide comparable cooling capacity with better control while reducing mass and volume significantly.

Figure 5:
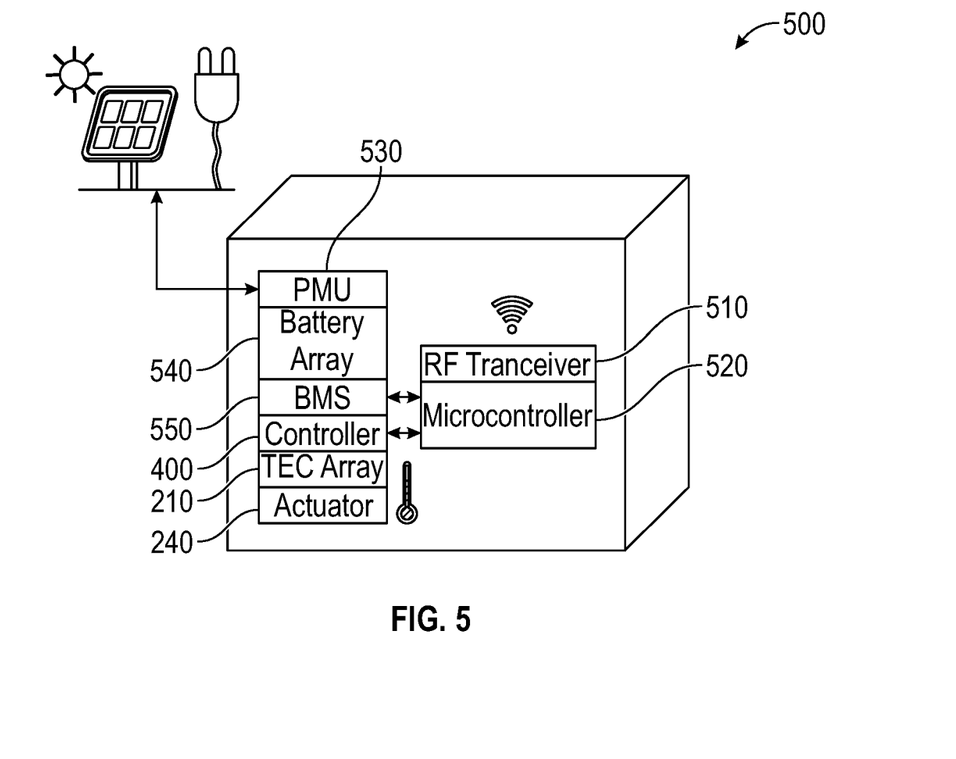
FIG. 5 shows another embodiment of a controller for the portable temperature regulated container system of FIG. 1.

FIG. 5 shows a diagram of an alternative controller 500 for controlling operation of the system 100. In FIG. 5, the power source 410 is divided into two parts, an external power source (AC power, DC power, solar cells, etc.) that is connectable and a battery array, which is part of the system 100. The alternative controller 500 may include a wireless transceiver 510 for receiving control instructions and transmitting telemetry data from the system 100, a microcontroller 520 for interfacing with the control circuit 400, a power management unit 530 for charging a battery array 540, a battery management system 550 for regulating the power from the battery array 540 delivered to the thermoelectric converters 210 and the actuators 240. The wireless transceiver may use Wi-Fi, Bluetooth, or other wireless communication known to persons of ordinary skill in the art.

Figure 6:
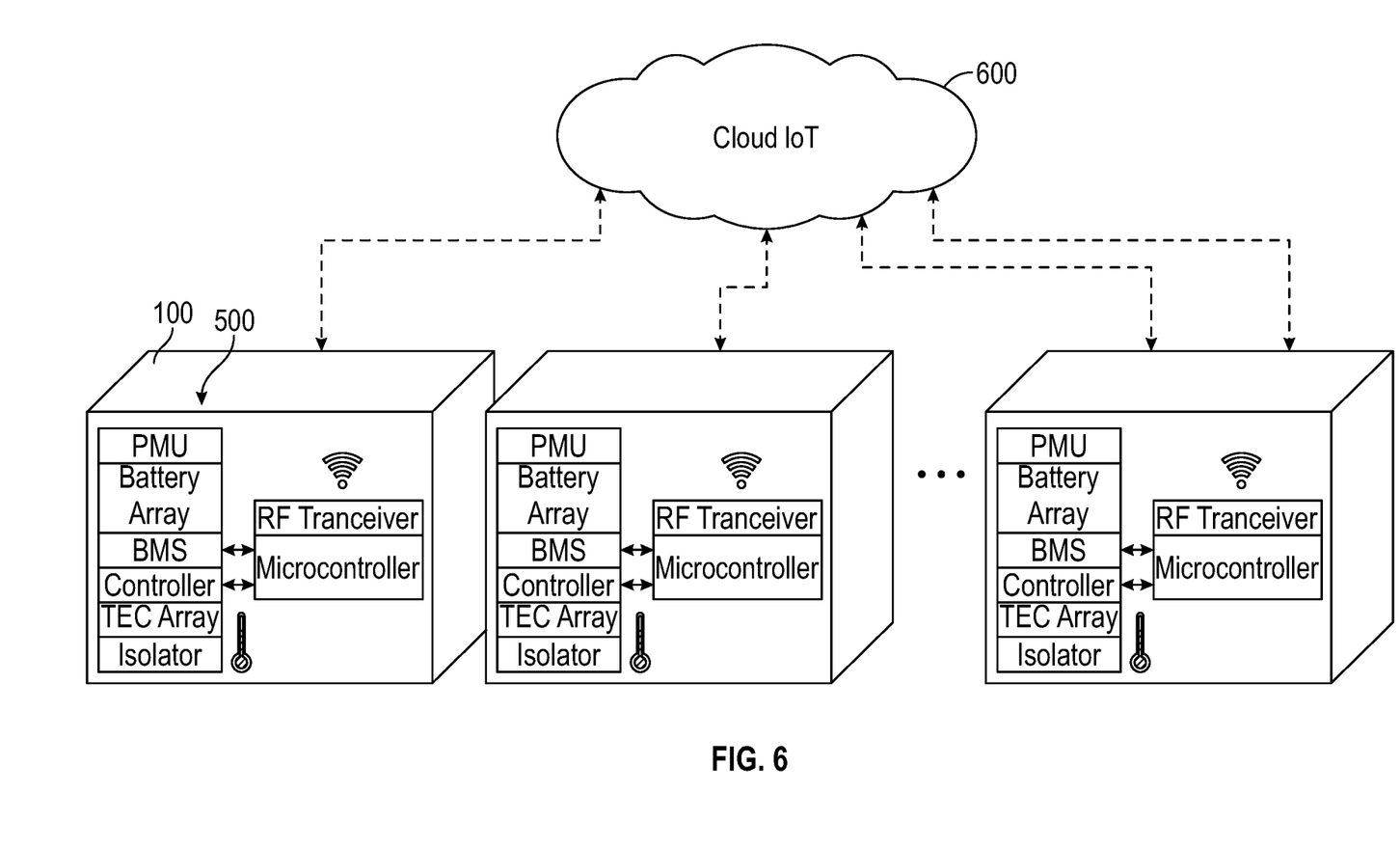
FIG. 6 shows a network of controllers from FIG. 4B for controlling a plurality of portable temperature regulated containers from FIG. 1.

FIG. 6 shows a diagram of an array of alternative controllers 500, each associated with a system 100. The plurality of systems 100 may be controlled through signals received from a central controller 600, such as an internet cloud-based transmitter.

In operation, the power is supplied to the thermoelectric converters 210 from a power source 410, 540 to cool a payload in the payload container 140 when active cooling is required. Heat is removed from the payload container 140 through fluid circulation path 237 to the thermoelectric converters 210, and then heat is removed from the thermoelectric converters 210 to the ambient environment through fluid circulation path 227. The removal of heat may be enhanced through forced flow of the fluids via fans/pumps 235, 225. During active cooling, the isolators 310 are in an open position. While in active cooling mode, optional PCM within the system 100 may also be cooled. Once a set point is reached for adequate cooling or a command is received to stop cooling, the control circuit 400 will shut off the power to the thermoelectric converters 210 and the fans/pumps 235, 225, and signal the actuators 240 to close the isolators 310. With the isolators 310 in the closed position, the cold side circulation path 237 is isolated and the cold side circulation housing behaves as a thermal diode, preventing the back flow of heat from the thermoelectric converters 210 into the payload container 140 via the cold side circulation path 237.

Figure 7:
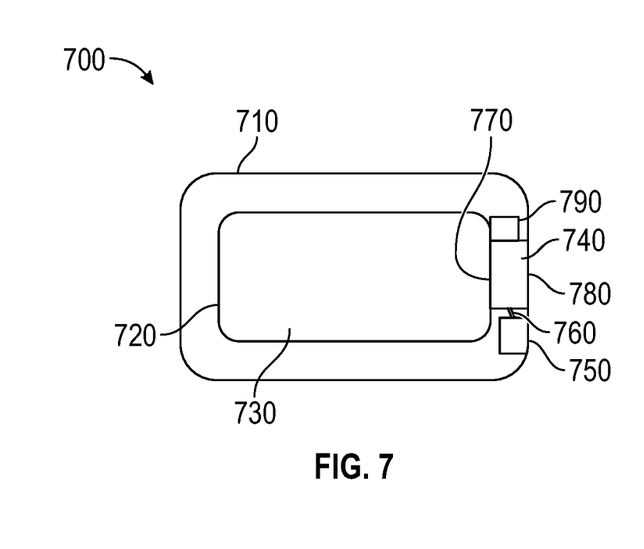
FIG. 7 shows a diagram of a portable temperature regulated container according to one embodiment of the present disclosure.

FIG. 7 shows a diagram of a portable thermoelectric container 700 that includes a thermally insulated housing 710 and an interior container 720 that forms a chamber 730. The thermally insulated housing 710 opens to allow access to the interior container 720 and/or the chamber 730. The thermally insulated housing 710 may comprise one or more of: a flexible polymer aerogel, polystyrene fibers, flexible encapsulations of silica aerogels, vacuum insulated panels, and aerogel sheets. The thermally insulated housing may be rigid or flexible. In some embodiments, the interior container 720 is optional, and the thermally insulated housing 710 may form the chamber 730. A thermoelectric converter 740 is disposed in the thermally insulated housing 710 between the wall of the interior container 720 and the ambient environment (or between the chamber 730 and the ambient environment). The thermoelectric converter may be of a type similar to the thermoelectric converter 210. The thermoelectric converter 740 is powered by a power supply 750 through an electrical power line 760. The power supply 760 may include a battery. In some embodiments, the power supply 760 may be partially embedded in the housing such that at least one side of the power supply is exposed to ambient air. In some embodiments, the power supply 760 may be removable from the housing 710. The power supply 750 may be of a type similar to the power supply 410, 540.

The thermoelectric converter 740 has a cold side 770 and a hot side 780. As shown, the cold side 770 is in thermal communication with the interior container 720 and the hot side 780 is in thermal communication with the ambient environment. In this configuration, the chamber 730 may be cooled or maintained at a temperature below that of the ambient environment. It is also contemplated that, in some embodiments, the position of or current flow through the thermoelectric converter 740 may be reversed so that the chamber 730 may be heated or maintained at a temperature above that of the ambient environment. A control circuit 790 may be disposed adjacent to the chamber 730 to measure the temperature within and provide control feedback to the thermoelectric converter 740, such that the thermoelectric converter 740 is cycled on and off to maintain a controlled temperature within the chamber 730. In some embodiments, a PCM material may be disposed in the interior container 720 or in the housing 710 adjacent to the chamber 710. The control circuit 790 may include a temperature sensor, such as a thermocouple or thermistor, to provide electrical feedback proportional to the temperature inside the chamber 730. The control circuit 790 may use digital pulse width modulation, analog PID loops, or other suitable temperature regulation control as would be understood by a person of skill in the art.

Figure 8:
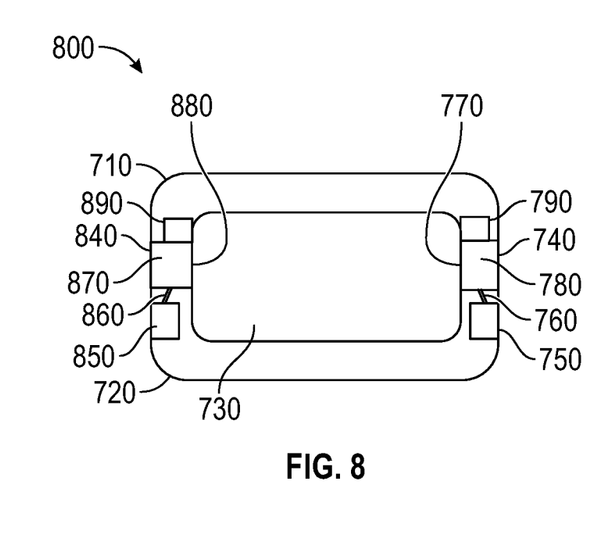
FIG. 8 shows a diagram of a portable dual temperature regulated container with a single chamber according to one embodiment of the present disclosure.

FIG. 8 shows a diagram of a dual temperature portable thermoelectric container 800 that includes a thermally insulated housing 710 and an interior container 720 that forms a chamber 730. In some embodiments, the interior container 720 is optional, and the thermally insulated housing 710 may form the chamber 730. Thermoelectric converters 740, 840 are disposed in the thermally insulated housing 710 between the wall of the interior container 720 and the ambient environment (or between the chamber 730 and the ambient environment). The thermoelectric converter 840 may be of the same or different configuration as the thermoelectric converter 210, 740. The thermoelectric converter 740 is powered by a power supply 750 through an electrical power line 760. The thermoelectric converter 840 is powered by a power supply 850 through an electrical power line 860. The thermoelectric converter 740 has a cold side 770 and a hot side 780, and the thermoelectric converter 840 has a cold side 870 and a hot side 880 The power supplies 750, 850 may be of a type similar to the power supplies 410, 540. The power supplies 750, 850 can provide power to different thermoelectric converters 740, 840, respectively, or the power supply 750 may supply power to multiple thermoelectric converters 740, 850 840(not shown). As shown, the cold side 770 is in communication with the interior container 720, the hot side 780 is in contact with the ambient environment, the cold side 870 is in thermal communication with the ambient environment, and the hot side 880 is in thermal communication with the interior container 720. In this configuration, the thermoelectric converter 740 may operate to cool the chamber 730 or maintain the chamber 730 at a temperature below the ambient environment while the thermoelectric converter 840 is off, or the thermoelectric converter 840 to heat the chamber 730 may operate to maintain the chamber 730 at a temperature above the ambient environment while the thermoelectric converter 740 is off. A control circuit 890 may be disposed adjacent to the chamber 730 to measure the temperature within and provide control feedback to the thermoelectric converter 840, such that the thermoelectric converter 840 is cycled on and off to maintain a controlled temperature within the chamber 730. In some embodiments, the control circuits 790, 890 may communicate to provide a temperature deadband or other means to prevent continuous cycling of the thermoelectric converters 740, 840. In some embodiments, a PCM material may be disposed in the interior container 720 or in the housing 710 adjacent to the chamber 730.

Figure 9:
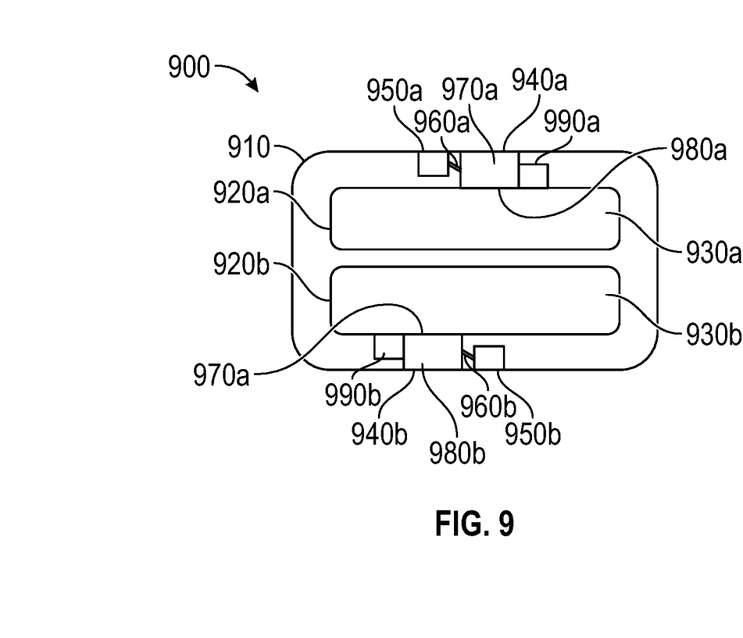
FIG. 9 shows a diagram of a portable dual temperature regulated container with dual chambers according to one embodiment of the present disclosure.

FIG. 9 shows a diagram of a dual chambered, dual temperature portable thermoelectric container 900 that includes a thermally insulated housing 910, a first interior container 920a that forms a first chamber 930a, and a second interior container 920b that forms a second chamber 930b. In some embodiments, the one or more of the interior containers 920a, 920b are optional, and the thermally insulated housing 910 may form one or more of the chambers 930a, 930b. The thermally insulated housing 910 opens to allow access to the interior containers 920a, 920b and/or the chambers 930a, 930b. Thermoelectric converters 940a, 940b are disposed in the thermally insulated housing 910 between the walls of the interior containers 920a, 920b and the ambient environment (or between the chambers 930a, 930b and the ambient environment). The thermoelectric converters may be of the same type as or different from the thermoelectric converters 210, 740, 840. The thermoelectric converters 940a, 940 may be powered by one or more power supplies 950a, 950b through electrical power line 960a, 960b, respectively. The power supplies 950a, 950b may be of the same type as or similar to the power supplies 410, 540. Each of the thermoelectric converters 940a, 940b may have a cold side 970a, 970b and a hot side 980a, 980b, respectively, and may be disposed such that the first chamber 930a may be heated while the second chamber 930b is cooled. While shown with the thermoelectric converter 940a disposed in the housing 910 with the hot side 980a adjacent to the chamber 930a and the cold side 970b adjacent to the ambient environment and thermoelectric converter 940b disposed in the housing 910 with the cold side 970b adjacent to the chamber 930b and the hot side 980b adjacent to the ambient environment, either of the thermoelectric converters 940a, 940b may be reversed (either physically or electrically) to switch between heating and cooling. There are no limitations on electrically switching the operation of the thermoelectric converters 940a, 940b between cooling and heating modes. This is also the case for the other thermoelectric converters discussed throughout this disclosure. Thus, as shown the chamber 930a will be heated relative to the ambient environment and the chamber 930b will be cooled relevant to the ambient environment. It is contemplated the thermoelectric converters 940a, 940b may be also be configured to heat both chambers 930a, 930b or cool both chambers 930a, 930b to the same temperature or to two different temperatures. In some embodiments, the containers 920a, 920b may be formed of insulation or be part of the housing 910. Control circuits 990a, 990b may be disposed adjacent to the chambers 930a, 930b to measure the temperature within and provide control feedback to the thermoelectric converters 940a, 940b, such that the thermoelectric converters 940a, 940b are cycled on and off to maintain a controlled temperature within the chambers 930a, 930b, respectively. In some embodiments, a PCM material may be disposed in one or more of the interior containers 920a, 920b or in the housing 910 adjacent to one or more of the chambers 930a, 930b.

Figure 10:
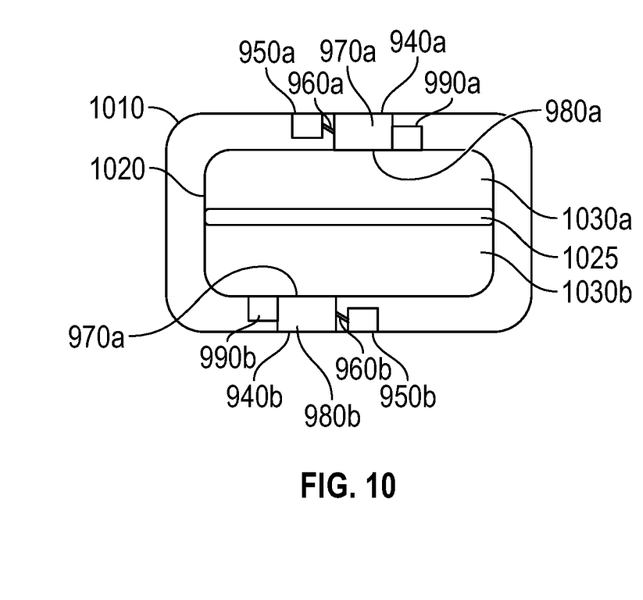
FIG. 10 shows a diagram of a portable dual temperature regulated container with a single and dual chamber configurations and a removable separator according to one embodiment of the present disclosure.

FIG. 10 shows a diagram of a dual temperature portable thermoelectric container 1000 that includes the thermally insulated housing 1010, an interior container 1020, and a removable thermally insulated separator or partition 1025, which can divide the interior container 1020 to form a first subchamber 1030a, and a second subchamber 1030b. The partitions 1025 may be made of any of the materials suitable for the housing 1010. In some embodiments, the thermally insulated partition 1025 may be inserted into the interior container 1020 when the housing 1010 is open, such as when the housing 1-10 is equipped with a lid portion. Thus, the combined chamber formed by the interior container 1020 may be heated or cooled, or individual chambers 1030a, 1030b may be heated or cooled. The insulated partition 1025 may be made of the same or a different thermally insulating material than the housing 1010. In some embodiments, the interior container 1020 is optional, and the thermally insulated housing 1110 may form the subchambers 1030a, 1030b in combination with the partition 1025. As in FIG. 9, the thermoelectric converters 940a, 940b are disposed in the thermally insulated housing 1010 between the walls of the interior containers 920a, 920b and the ambient environment (or between the chambers 930a, 930b and the ambient environment). The thermoelectric converters 940a, 940 may be of the same type as or different from the thermoelectric converters 210, 740, 840. The thermoelectric converters 940a, 940 may be powered by one or more power supplies 950a, 950b through electrical power line 960a, 960b, respectively. The power supplies 950a, 950b may be of the same type as or similar to the power supplies 410, 540. Each of the thermoelectric converters 940a, 940b may have a cold side 970a, 970b and a hot side 980a, 980b, respectively, and may be disposed such that the first chamber 930a may be heated while the second chamber 930b is cooled. While shown with the thermoelectric converter 940a disposed in the housing 910 with the hot side 980a adjacent to the chamber 930a and the cold side 970b adjacent to the ambient environment and thermoelectric converter 940b disposed in the housing 910 with the cold side 970b adjacent to the chamber 930b and the hot side 980b adjacent to the ambient environment, either of the thermoelectric converters 940a, 940b may be reversed (either physically or electrically) to switch between heating and cooling. Thus, as shown the subchamber 1030a will be heated relative to the ambient environment and the subchamber 1030b will be cooled relevant to the ambient environment. It is contemplated the thermoelectric converters 940a, 940b may be also be configured to heat both subchambers 1030a, 1030b or cool both subchambers 1030a, 1030b to the same temperature or to two different temperatures. It is also contemplated that the partition 1025 may be removed to form a combination of the subchambers 1030a, 1030b. Control circuits 990a, 990b may be disposed adjacent to the subchambers 1030a, 1030b to measure the temperature within and provide control feedback to the thermoelectric converters 940a, 940b, such that the thermoelectric converters 940a, 940b are cycled on and off to maintain a controlled temperature within the subchambers 1030a, 1030b, respectively. In some embodiments, a PCM material may be disposed in the interior container 1020 or in the housing 1110 adjacent to one or more of the subchambers 1030a, 1030b.

Figure 11:
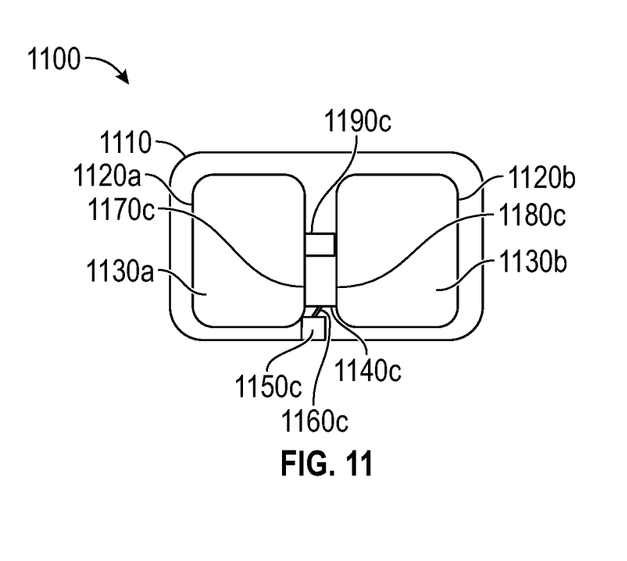
FIG. 11 shows a diagram of a portable dual temperature regulated container with dual chambers and a shared thermoelectric device according to one embodiment of the present disclosure.

FIG. 11 shows a diagram of a dual chambered, dual temperature portable thermoelectric container 1100 that includes a thermally insulated housing 1110, a first interior container 1120a that forms a first chamber 1130a, and a second interior container 1120b that forms a second chamber 1130b. In some embodiments, one or more of the interior containers 1020a, 1020b are optional, and the thermally insulated housing 1110 may form one or more of the chambers 1030a, 1030a. The thermally insulated housing 1110 opens to allow access to at least one of the interior containers 1120a, 1120b and/or the chambers 1130a, 1130b. A thermoelectric converter 1140c is disposed adjacent to and between the interior containers 1120a, 1120b (or the chambers 1130a, 1130b). The thermoelectric converter 1140c may be of the same type as or different from the thermoelectric converters 210, 740, 840. The thermoelectric converter 1140c may be powered by a power supply 1150c through electrical power line 1160c. The power supply 1150c may be of the same type or similar to the power supply 410, 540. The thermoelectric converter 1140c may have a cold side 1170c and a hot side 1180c, which may be disposed such that the cold side 1170c is in thermal communication with the first chamber 1130a and the hot side 1180c is in thermal communication with the second chamber 1130b. In some embodiments, the cold side 1170c and the hot side 1180c may be reversed either physically or electrically. Since the chambers 1130a, 1130b are thermally insulated from the ambient environment, the heat transfer provided by the thermoelectric converter 1140c is between the chambers 1130a, 1130b. Thus, a cold temperature chamber and a hot temperature chamber may be maintained using a single thermoelectric converter. Control circuit 1190c may be disposed adjacent to the chambers 1130a, 1130b to measure the temperatures within and provide control feedback to the thermoelectric converter 1140c, such that the thermoelectric converter 1140c is cycled on and off to maintain a controlled temperature within the one of the chambers 1130a, 1130b or to maintain a predetermined temperature difference between the chambers 1130a, 1130b. In some embodiments, a PCM material may be disposed in one or more of the interior containers 1120a, 1120b or in the housing 1110 adjacent to one or more of the chambers 1130a, 1130b.

Figure 12:
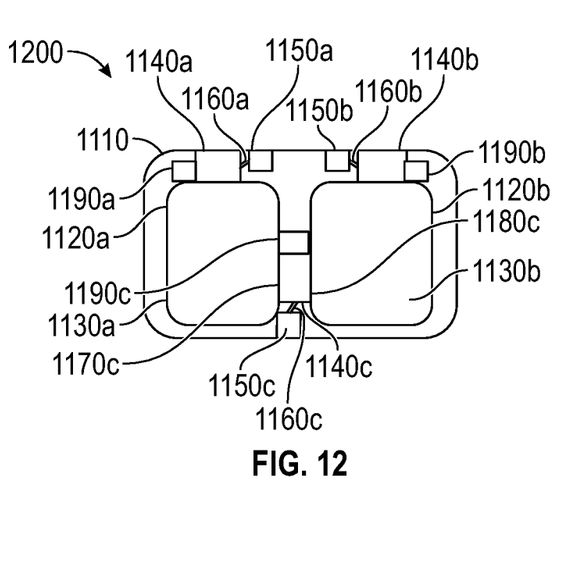
FIG. 12 shows a diagram of a portable temperature regulated container with dual chambers and independent and shared thermoelectric devices according to one embodiment of the present disclosure.

FIG. 12 shows a diagram of a dual chambered, dual temperature portable thermoelectric container 1200 that combines features of container 900 and container 1100. The container 1200 includes a thermally insulated housing 1110, a first interior container 1120a that forms a first chamber 1130a, and a second interior container 1120b that forms a second chamber 1130b. Again, one or more of the interior containers 1120a, 1120b may be optional, and the thermally insulated housing 1110 may form the chambers 1130a, 1130b. Thermoelectric converters 1140a, 1140b are disposed in the thermally insulated housing 1110 between the walls of the interior containers 1120a, 1120b and the ambient environment (or between the chambers 1130a, 1130b and the ambient environment). The thermoelectric converters 1140a, 1140b may be of the same type as or different from the thermoelectric converters 210, 740, 850. The thermoelectric converters 1140a, 1140b may be powered by one or more power supplies 1150a, 1150b through electrical power lines 1160a, 1160b, respectively. The one more power supplies 1150a, 1150b may be of the same type or similar to the power supplies 410, 540. Thermoelectric converter 1140c is disposed adjacent to and between the interior containers 1120a, 1120b. The thermoelectric converter 1140c may be powered by a power supply 1150c through electrical power line 1160c. Each of the thermoelectric converters 1140a, 1140b, 1140c may have a cold side 1170a, 1170b, 1170c and a hot side 1180a, 1180b, 1180c, respectively, and may be disposed such that the first chamber 1130a may be heated or cooled relative to the ambient environment and/or relative the second chamber 1130b. The container 1200 may operate similar to the container 1100 when the thermoelectric converters 1140a and 1140b are unpowered, and the container 1200 may operate similar to the container 900 when the thermoelectric converter 1140c is unpowered. It is contemplated the thermoelectric converters 1140a, 1140b may be also be configured to heat the chambers 1130a, 1130b or cool both chambers 1130a, 1130b while the thermoelectric converter 1140c heats or cools the chamber 1130a relative to the chamber 1130b. In some embodiments, the containers 1120a, 1120b may be formed of insulation or be part of the housing 1110. Control circuit 1190c may be disposed adjacent to the chambers 1130a, 1130b to measure the temperatures within one or both of the chambers 1130a, 1130b and/or the temperature differential between the two chambers 1130a, 1130b and to provide control feedback to the thermoelectric converter 1140c, such that the thermoelectric converter 1140c is cycled on and off to maintain a controlled temperature in at least one of the chambers 1130a, 1130b or to maintain a predetermined temperature difference between the chambers 1130a, 1130b. Control circuits 1190a, 1190b may be disposed adjacent to the chambers 1130a, 1130b to measure the temperature within and provide control feedback to the thermoelectric converters 1140a, 1140b, such that the thermoelectric converters 1140a, 1140b are cycled on and off to maintain a controlled temperature within the chambers 1130a, 1130b, respectively. One or more of the control circuits 1190a, 1190b, 1190c may be active at the same time. In some embodiments, a PCM material may be disposed in one or more of the interior containers 1120a, 1120b or in the housing 1110 adjacent to one or more of the chambers 1130a, 1130b.

While the disclosure has been described with reference to exemplary embodiments, it will be understood that various changes may be made and equivalents may be substituted for elements thereof without departing from the scope of the disclosure. In addition, many modifications will be appreciated to adapt a particular instrument, situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A system for portable temperature control, comprising:
   a thermally insulated housing with air circulation openings and a raised guard maintaining spacing for the openings to maintain air circulation;
   a payload container;
   a thermoelectric engine, the engine comprising:
      one or more thermoelectric converters, each having a hot side and a cold side;
      a hot side circulation housing to circulate a first fluid between ambient and the hot side(s) of the one or more thermoelectric converters;
      a cold side circulation housing to circulate a second fluid between the cold side(s) of the one or more thermoelectric converters and the payload container;
      wherein the cold side circulation housing comprises:
         a set of isolators interior to the cold side circulation housing, where the set of isolators comprises:
            a first isolator disposed at an inlet to the cold side circulation housing, and
            a second isolator disposed at an outlet to the cold side circulation housing; and
         a set of actuators in communication with the set of isolators and configured to control a flow path of the second fluid, where each isolator of the set of isolators is associated with at least one actuator of the set of actuators;
   a power source in electrical communication with the thermoelectric converters and the set of actuators; and
   a control circuit in electrical communication with the thermoelectric converters, the set of actuators, and the power source;
   wherein the set of isolators is configured to have an open position and a closed position, where the closed position stops all circulation of the second fluid to reduce heat leakage into the payload container.

2. The system of claim 1, wherein the thermally insulated housing comprises one or more of:
   an aerogel, polystyrene fibers, and a vacuum insulated panel.

* * * * *